March 9, 1971 | W. F. C. H. VAN PAPENDRECHT ET AL | 3,570,001

ALLOYED SEMICONDUCTOR DEVICE WITH ALUMINUM AND MAGNESIUM ELECTRODE

Filed June 27, 1968 | 2 Sheets-Sheet 1

INVENTORS

WILLEM FREDERICK CHALMERS HOYINCK VAN PAPENDRECHT

BY BERNHARD WILDE

AGENT

March 9, 1971 — W. F. C. H. VAN PAPENDRECHT ET AL — 3,570,001

ALLOYED SEMICONDUCTOR DEVICE WITH ALUMINUM AND MAGNESIUM ELECTRODE

Filed June 27, 1968 — 2 Sheets-Sheet 2

INVENTORS
WILLEM FREDERICK CHALMERS HOYINCK VAN PAPENDRECHT
BERNHARD WILDE
BY [signature]
AGENT United States Patent Office 3,570,001
Patented Mar. 9, 1971

3,570,001

ALLOYED SEMICONDUCTOR DEVICE WITH ALUMINUM AND MAGNESIUM ELECTRODE

Willem Frederik Chalmers Hoyinck van Papendrecht, Nijmegen, Netherlands, and Bernhard Wilde, Hamburg, Germany, assignors to U.S. Philips Corporation, New York, N.Y.

Filed June 27, 1968, Ser. No. 740,510
Claims priority, application Germany, June 29, 1967, P 16 14 262.4
Int. Cl. H01l 3/14
U.S. Cl. 317—234 6 Claims

ABSTRACT OF THE DISCLOSURE

A device whose breakdown voltage is improved by adding to the alloyed electrode, which contains aluminum to flatten the alloying front, magnesium to round off the front edges, is described.

The invention relates to a method of manufacturing a semiconductor device, for example, a transistor, a rectifier diode, a photodiode, or an integrated circuit element, having an alloy electrode provided on a monocrystal semiconductor body. An alloy electrode is to be understood to mean herein an electrode which is obtained in that on a surface of a semiconductor body is provided a quantity of a material, usually a metal or an alloy, hereinafter termed "electrode material," which has a lower melting point than the semiconductor material, after which the assembly is heated to a temperature above the melting point of the electrode material, but below that of the semiconductor material, and is then cooled. During alloying some semiconductor material is dissolved in the electrode material which recrystallizes out on cooling and grows onto the semiconductor body. The interface between the semiconductor material which has not been dissolved and the recrystallized semiconductor material is referred to as the "alloying front."

It is to be noted that the electrode material may be provided on the semiconductor body in various manners. It may be placed on the semiconductor body in the solid state for example, in the form of a ball, preferably in an alloying jig, after which the assembly is heated above the melting temperature of the electrode material or at least above the eutectic temperature of the electrode material and the semiconductor material (see German Pats. 976,-348 and 976,360).

Alternatively, the electrode material may be dropped in molten state on the semiconductor body usually after heating the material in a reducing gas, in order that the mutual contact surfaces become very pure (see German Auslegeschrift 1,230,911). In particular with this method it is further possible to drop the quantity of electrode material on the semiconductor body in two or several portions. This method may be advantageous when the electrode material contains components, such as the element aluminum, which difficultly may alloy with a semiconductor body. However, the electrode material may also be provided on the semiconductor body as an adhering layer, for example, by vapour deposition in vacuo after which the assembly may be heated (see Dutch patent application No. 6,511,474).

It is known that the shape of the alloying front depends upon various factors and influences the electrical properties of the semiconductor device. Initially, diodes and transistors were often manufactured by alloying indium or germanium. Usually a curved alloying front was obtained (see, for example Moore and Pankove, P.I.R.E., June 1954, pp. 907 to 913).

Later on, in order both to improve the electrical properties of the electrodes and to obtain a flat alloying front, electrodes were usually used in germanium transistors, which contained, for example, in addition to indium, small quantities of another element, for example, aluminum (see German application specification (Auslegeschrift 1,036,392). It is known that such electrodes in electrical respect are weakest at the peripheral regions of the alloying front and that when said electrodes are operated in the reverse direction a breakdown usually occurs first at said peripheral regions. It has already been proposed to remove said peripheral regions mechanically (German patent specification 1,018,555 and German application specification (Auslegeschrift 1,209,661). However, said method is difficult to perform not in at least owing to the dimensions of the electrodes which are usually small. Although the weakness of the peripheral regions can most simply be proved by electrical breakdown, it may be concluded that mechanical deficiencies also play a role.

In general the object of the invention is to provide a method of manufacturing a semiconductor device with an alloy electrode, in which weak regions at the periphery do not occur or occur at least to a far smaller extent. The invention is based on the determination that the occurrence of said weak regions is associated with the use of electrode materials which produce a flat alloying front in that during alloying they do not only accurately follow crystallographic planes of the semiconductor body below the electrode, but also at their peripheral regions so that sharp edges are formed at said peripheral regions which adversely influence the electric field distribution and may also result in other disturbances. The invention is further based on the recognition of the fact that certain elements may be added to the electrode material in such small quantities that they do not prevent the formation of a flat alloying front but do prevent the formation of sharp edges at the peripheral regions.

According to one aspect of the invention, a method of manufacturing a semiconductor device having an alloy electrode provided on a single crystal semiconductor body is characterized in that at least one element is added to the electrode material which consists at least partly of aluminum in such a quantity that the addition does not prevent the formation of a flat alloying front but produces a rounding of the edges of said alloying front.

Magnesium is preferably used as an additional element. According to a further embodiment, at least $2.10^{-4}\%$ by weight and at most $2.10^{-1}\%$ by weight of Mg is added. It has been found that this addition has a favourable effect, particularly in an electrode material consisting mainly of indium and containing in known manner at least $10^{-2}\%$ and at most 1% by weight of aluminum; this electrode material may further contain a small quantity of a semiconductor material, for example, germanium or silicon (see German patent specification 961,913).

The electrode may also contain up to about 0.3% by weight of magnesium. A preferred electrode with such a magnesium content mainly consists of indium and contains 0.1–0.2% by weight of aluminum.

It has furthermore been found that the addition of the above elements which promotes rounding of the edges of the alloying front has a particularly favourable effect in alloy electrodes which are provided on a surface of a germanium or silicon single crystal wafer, the flat faces of which are oriented according to a [111]-plane.

In order that the invention may be readily carried out into effect, an embodiment thereof will now be described in greater detail, by way of example, with reference to the accompanying figures, in which FIGS. 1, 3 and 5 are cross-sectional views through semiconductor bodies which are provided with a single alloy electrode.

FIGS. 8*a* to 8*d* show an alloying jig in various positions suitable for use in the method according to the invention.

FIGS. 1 to 4 relate to known semiconductor devices, while FIGS. 5 to 8 relate to devices according to the invention.

For clearness sake all the figures are shown on an enlarged scale and are drawn very diagrammatically.

Figure 1:
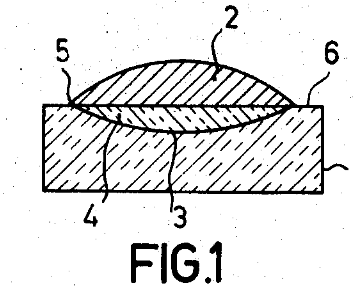
Figure 2:
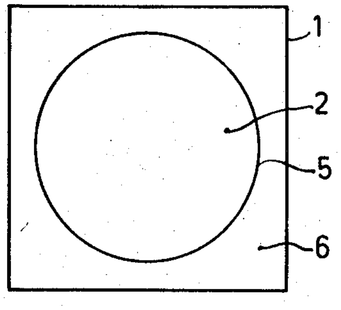
FIGS. 2, 4 and 6 are plan views on said bodies with electrodes, the cross-sectional views of which are shown in FIGS. 1, 3 and 5 respectively.

FIGS. 1 and 2 show a semiconductor body 1 which consists of a germanium single crystal of n-conductivity type, the upper surface 6 of which is oriented according to a [111]-plane. An electrode 2 consisting of indium is alloyed to said upper surface 6. The alloying front 3 has a concave shape. The part of the semiconductor body which has been dissolved in the electrode material during alloying and recrystallized afterwards is denoted by 4. Because said part is saturated with indium it has obtained the p-conductivity type. FIG. 2 further shows that the shape of the curve 5 along which the alloying front 3 intersects the upper surface 6 of the semiconductor body 1 is substantially circular. So when said electrode material is used, the alloying front will substantially not follow crystallographic planes of the crystal lattice of the semiconductor body.

Figure 3:
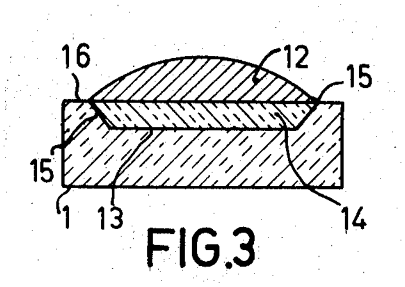
Figure 4:
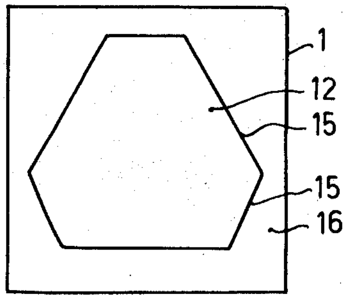

FIGS. 3 and 4 show a semiconductor device similar to that shown in FIGS. 1 and 2, with the difference that indium with a content of 0.3% by weight of aluminum was used as the electrode material. It is quite obvious that the alloying front 13 is accurately oriented according to a [111]-plane with the alloying front intersects the upper surface 16 according to a hexagon 15, the shape of which may be described as that of an equilateral triangle having truncated corners. It is just the sharp edges of said alloying front which reduce the breakdown voltage when the electrode 12 is rectifying and is operated in the reverse direction. In this case and in other cases the sharp edges may produce lattice defects.

Figure 5:
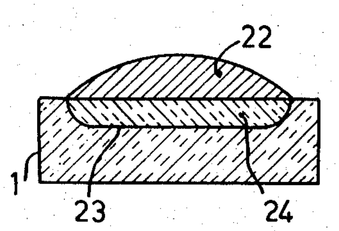
Figure 6:
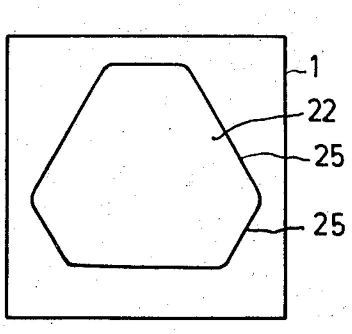

FIGS. 5 and 6 show such a semiconductor device in which, in addition to aluminum, magnesium is added to the electrode material namely approximately 0.3% by weight of aluminum and $1.10^{-2}$% by weight of magnesium, the electrode consisting otherwise of indium with some germanium dissolved therein during alloying. The alloying front 23 is still oriented according to a [111]-plane and the peripheral regions 25 of the recrystallized part 24 also shown an orientation according to [111]-planes but the edges which the peripheral regions 25 enclose with the alloying front 23 and which are shown in particular in the cross-sections shown in FIG. 5 are now rounded while the edges which the peripheral regions enclose with each other are also strongly rounded as is shown in FIG. 6. In this case the breakdown voltage is approximately 15% higher than without the addition of magnesium.

Experiments have proved that an increase of the magnesium content of the above-mentioned alloy results in a further rounding. A content higher than $2.10^{-2}$% by weight, however, is not used preferably because this may result in irregularities in the recrystallisation and produces no further increase of the break-down voltage.

Figure 7:
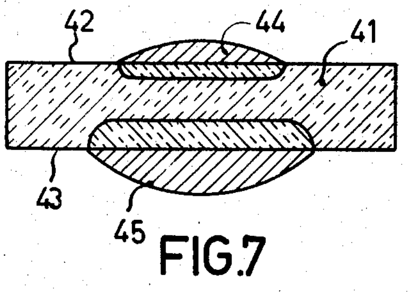
FIG. 7 is a cross-sectional view of a transistor.
Figure 8A:
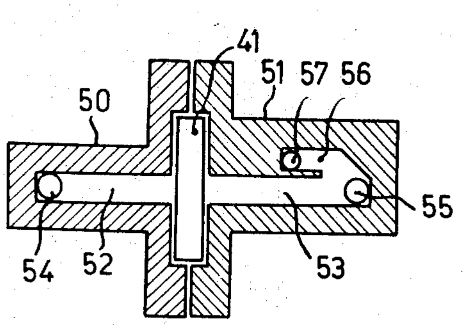
Figure 8B:
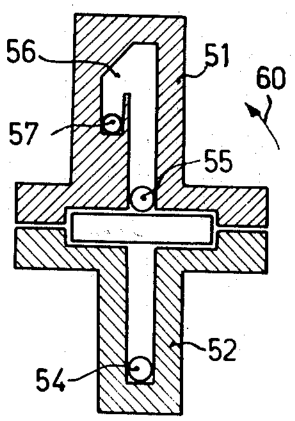
Figure 8C:
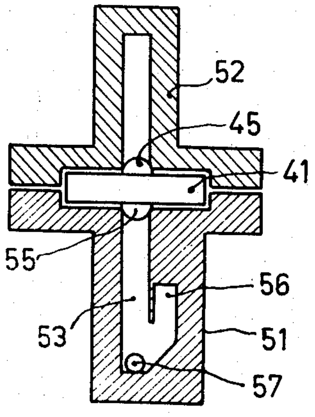
Figure 8D:
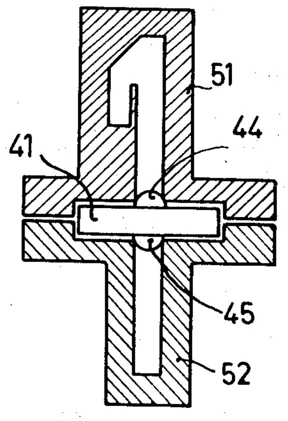

A method of manufacturing a transistor as shown in cross-section in FIG. 7 will now be described with reference to the following example.

Two electrodes, namely an emitter electrode 44 and a collector electrode 45 are alloyed onto a monocrystal semiconductor wafer 41 of germanium of the n-conductivity type having a resistivity of 2 ohm cm. a thickness of 20 microns and sides of 3.3 mm. the two largest boundary surfaces 42 and 43 of which are oriented according to a [111]-face. For this purpose a so-called tilting alloying jig is preferably used which is shown in various positions in FIGS. 8*a* to 8*d*. The alloying jig consists of two halves 50 and 51 which with their sides facing each other form a space for receiving the semiconductor body 41. These halves further comprise channels 52 and 53 in which the electrode material in the form of dots 54 and 55 can be placed. The channel 53 comprises a side channel 56 in which a third dot 57 can be placed. The alloying jig may consist in normal manner of graphite. After the assembly had been heated for some time in hydrogen at a temperature of approximately 500° C. in the position shown in FIG. 8*a*, it was cooled to 350° C. after which the jig was tilted about 90° in the direction of the arrow 60 until the position shown in FIG. 6*b* was reached. During this tilting movement the dot 55 fell on the body 41, the surface of which had been purified as well as that of the dot by the heating in hydrogen so that a good adhesion was obtained. The assembly was then tilted again in the same direction until the position shown in FIG. 8*c* was reached as a result of which the dot 54 was thrown on the body 41 and the collector electrode 45 was formed. These two dots 54 and 55 consisted of pure indium. During the last-mentioned tilting movement the dot 57 also fell out of the side channel 56 of the channel 53. When the alloying jig was tilted again about 180° until the position shown in FIG. 8*d* was reached, the dot 57 was thrown onto the dot 55 which has already been pre-alloyed as a result of which the emitter electrode 44 was formed. This dot 57 consisted of indium to which so much aluminum and magnesium had been added that the finished emitter contained approximately 0.15% by weight of aluminum and 0.2% by weight of magnesium.

The above described example relates to a transistor in which higher requirements are imposed upon the emitter breakdown voltage than could be achieved with an emitter consisting of indium and aluminum, while in this case the collector could consist of indium. In many types of transistors, however, aluminum is also added to the collector, particularly in transistors for high powers, in order that a comparatively large and flat alloying front may be obtained. In this case also the collector breakdown voltage can be improved by the addition of magnesium.

Also in cases in which an element, for example, aluminum, which during alloying has the property of forming an alloying front which is accurately determined by crystallographic planes, is the main constituent of the alloying material, the addition of an element, such as magnesium, which counteracts the above-described property may be of advantage. It was found that in diodes consisting of a semiconductor body of silicon of the n-conductivity type and an alloyed aluminum electrode, the percentage of diodes which did not reach a given breakdown voltage and thus were rejected could be reduced by the addition of a small quantity of magnesium.

Of course the invention is not restricted to the above-described examples. It may be used also, for example, in semiconductor devices which may rather be referred to, for example, as planar transistors or planar diodes because they have one or several junctions protected by oxide skins, as is often the case also in planar devices, but in which, however electrode material for example, vapour-deposited aluminum is alloyed. In such cases, for example, a small quantity of magnesium may be added to the aluminum to be vapour-deposited.

What is claimed is:

1. In a semiconductor device comprising a single crystal semiconductor body having a region of one type material and an aluminum-containing electrode material fused and alloyed at a surface of said one type region to form underneath the electrode material a recrystallized region of said opposite type conductivity material forming a substantially flat alloying front and a junction with said one type region, the improvement comprising said electrode material forming the junction also containing magnesium in an amount between $2\times10^{-4}\%$ and $2\times10^{-1}\%$ by weight effective to round off the edges of said alloying front and thereby increase the breakdown voltage of the junction.

2. A device as set forth in claim 1 wherein the electrode material further comprises indium and $10^{-2}\%$ to 1% by weight of the aluminum.

3. A device as set forth in claim 2 wherein the said surface at which the electrode is alloyed is oriented parallel to a [111]-plane, and the crystal is of germanium or silicon.

4. A device as set forth in claim 1 wherein the main constituent of the electrode is aluminum.

5. In a semiconductor device comprising a single crystal semiconductor body having a region of one type material and an aluminum-containing electrode material fused and alloyed at a surface of said one type region to form underneath the electrode material a recrystallized region of said opposite type conductivity material forming a substantially flat alloying front and a junction with said one type region, the improvement comprising said electrode material forming the junction also containing magnesium in an amount of about 0.3% by weight effective to round off the edges of said alloying front and thereby increase the breakdown voltage of the junction.

6. A device as set forth in claim 5 wherein the electrode is mainly of indium with 0.1–0.2% aluminum by weight.

References Cited

UNITED STATES PATENTS

| | | | |
|---|---|---|---|
| 2,850,413 | 9/1958 | Schmich | 317—234 |
| 3,013,910 | 12/1961 | Dehmelt et al. | 148—185 |

OTHER REFERENCES

IBM Tech. Discl. Bul., "Semicoductor Contacts" by Brodsky, vol. 7, No. 6, November 1964, p. 531.

JERRY D. CRAIG, Primary Examiner

U.S. Cl. X.R.

148—33.6, 185